(12) United States Patent
Tosi et al.

(10) Patent No.: US 12,195,873 B2
(45) Date of Patent: Jan. 14, 2025

(54) CRYSTAL PULLING SYSTEMS HAVING A COVER MEMBER FOR COVERING THE SILICON CHARGE AND METHODS FOR GROWING A MELT OF SILICON IN A CRUCIBLE ASSEMBLY

(71) Applicant: GlobalWafers Co., Ltd., Hsinchu (TW)

(72) Inventors: Paolo Tosi, Merano (IT); Matteo Pannocchia, Lana (IT); Roberto Scala, Merano (IT)

(73) Assignee: GlobalWafers Co., Ltd., Hsinchu (TW)

( * ) Notice: Subject to any disclaimer, the term of this patent is extended or adjusted under 35 U.S.C. 154(b) by 18 days.

(21) Appl. No.: 17/396,370

(22) Filed: Aug. 6, 2021

(65) Prior Publication Data

US 2022/0064816 A1 Mar. 3, 2022

Related U.S. Application Data

(60) Provisional application No. 63/073,180, filed on Sep. 1, 2020.

(51) Int. Cl.
  *C30B 15/10* (2006.01)
  *C30B 15/14* (2006.01)
  *C30B 29/06* (2006.01)

(52) U.S. Cl.
  CPC .............. *C30B 15/10* (2013.01); *C30B 15/14* (2013.01); *C30B 29/06* (2013.01); *Y10T 117/1052* (2015.01); *Y10T 117/1068* (2015.01)

(58) Field of Classification Search
  CPC ......... C30B 15/10; C30B 15/12; C30B 15/14; C30B 29/06; Y10T 117/1052; Y10T 117/1068
  See application file for complete search history.

(56) References Cited

U.S. PATENT DOCUMENTS

| 5,922,127 | A | 7/1999 | Luter et al. |
| 6,660,082 | B2 | 12/2003 | Weber et al. |
| 6,663,709 | B2 | 12/2003 | Lu et al. |
| 7,491,270 | B2 | 2/2009 | Sasaki et al. |
| 2004/0112277 | A1 | 6/2004 | Kulkarni |
| 2004/0226504 | A1 | 11/2004 | Nakashima et al. |
| 2005/0115493 | A1* | 6/2005 | Radkevich .............. C30B 15/30 117/200 |

(Continued)

FOREIGN PATENT DOCUMENTS

| CN | 201485536 U | 5/2010 |
| CN | 102828235 A * | 12/2012 |

(Continued)

OTHER PUBLICATIONS

International Search Report and Written Opinion in PCT/EP2021/073902, Nov. 15, 2021, 14 pages.

(Continued)

*Primary Examiner* — Hua Qi
(74) *Attorney, Agent, or Firm* — Armstrong Teasdale LLP

(57) ABSTRACT

Crystal pulling system having a housing and a crucible assembly are disclosed. The system includes a heat shield that defines a central passage through which an ingot passes during ingot growth. A cover member is moveable within the heat shield along a pull axis. The cover member may include an insulation layer. The cover member covers at least a portion of the charge during meltdown.

12 Claims, 20 Drawing Sheets

(56) References Cited

U.S. PATENT DOCUMENTS

| | | | |
|---|---|---|---|
| 2006/0254499 | A1 | 11/2006 | Furukawa et al. |
| 2009/0314996 | A1 | 12/2009 | Kawazoe et al. |
| 2011/0036860 | A1 | 2/2011 | Fujiwara et al. |
| 2012/0034415 | A1* | 2/2012 | Kato ................ D21H 13/50 |
| | | | 428/114 |
| 2012/0285373 | A1 | 11/2012 | Meyer et al. |
| 2013/0233237 | A1* | 9/2013 | Bender ............... C30B 15/002 |
| | | | 117/31 |
| 2015/0284876 | A1* | 10/2015 | Chuang ................ C30B 15/14 |
| | | | 117/223 |

FOREIGN PATENT DOCUMENTS

| | | | | |
|---|---|---|---|---|
| EP | 1338682 | A2 | 8/2003 | |
| JP | H02283693 | A | 11/1990 | |
| JP | 2001213691 | A | 8/2001 | |
| JP | 2004035357 | | 2/2004 | |
| JP | 2004292288 | A * | 10/2004 | |
| JP | 2005053722 | A | 3/2005 | |
| JP | 2011032150 | | 2/2011 | |
| KR | 1906308 | B1 * | 10/2018 | ............ C30B 15/20 |
| KR | 101906308 | B1 | 10/2018 | |
| WO | 2017012733 | A1 | 1/2017 | |

OTHER PUBLICATIONS

International Search Report and Written Opinion of the International Searching Authority mailed on Aug. 2, 2012 regarding PCT/US2012/03597 filed on May 1, 2012, 9 pages.

* cited by examiner

CRYSTAL PULLING SYSTEMS HAVING A COVER MEMBER FOR COVERING THE SILICON CHARGE AND METHODS FOR GROWING A MELT OF SILICON IN A CRUCIBLE ASSEMBLY

CROSS-REFERENCE TO RELATED APPLICATION

This application claims the benefit of U.S. Provisional Patent Application No. 63/073,180, filed Sep. 1, 2020, which is incorporated herein by reference in its entirety.

FIELD OF THE DISCLOSURE

The field of the disclosure relates to crystal pulling systems for growing a monocrystalline ingot from a silicon melt and, in particular, crystal pulling systems that include a cover member for use in continuous Czochralski silicon ingot growth.

BACKGROUND

Silicon crystal silicon ingots may be prepared by the Czochralski method in which a single crystal silicon seed is contacted with a silicon melt held within a crucible. The single crystal silicon seed is withdrawn from the melt to pull a single crystal silicon ingot from the melt. The ingot may be prepared in a batch system in which a charge of polycrystalline silicon is initially melted within the crucible and the silicon ingot is withdrawn from the melt until the melted silicon within the crucible is depleted. Alternatively, the ingot may be withdrawn in a continuous Czochralski method in which polysilicon is intermittently or continuously added to the melt to replenish the silicon melt during ingot growth.

In a continuous Czochralski method, the crucible may be divided into separate melt zones. For example, the crucible assembly may include an outer melt zone in which polycrystalline silicon is added and melted to replenish the silicon melt as the silicon ingot grows. The silicon melt flows from the outer melt zone to an intermediate zone within the outer melt zone in which the melt thermally stabilizes. The silicon melt then flows from the intermediate zone to a growth zone from which the silicon ingot is pulled.

Crystal pulling systems may include a heat shield disposed above the crucible and the silicon melt. The heat shield includes a passage through which the silicon ingot passes as it is drawn vertically from the silicon melt. The heat shield protects and shields the drawn ingot from radiant heat from the melt.

During the melting phase, a temperature gradient may be created within the crystal pulling system. The temperature gradient creates thermal stress in the crucible resulting in damage, and in some cases, destruction of the crucible.

A need exists for crystal pulling systems that maintain a more uniform temperature gradient during meltdown to reduce crucible damage during meltdown.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a crystal pulling system for growing a monocrystalline ingot from a silicon melt. The system includes a pull axis and a housing defining a growth chamber. A crucible assembly is disposed within the growth chamber for containing the silicon melt. A heat shield defines a central passage through which an ingot passes during ingot growth. The System includes a cover member that is moveable within the heat shield along the pull axis. The cover member includes one or more insulation layers.

Another aspect of the present disclosure is directed to a method for preparing a melt of silicon in a crucible of a crystal pulling system. The crystal pulling system includes a housing defining a growth chamber, a crucible assembly disposed within the growth chamber for containing the silicon melt and a heat shield that defines a central passage through which an ingot passes during ingot growth. A charge of solid polycrystalline silicon is added to the crucible assembly. A cover member is lowered through the central passage defined by the heat shield to cover at least a portion of the charge. The silicon charge is heated to produce a silicon melt in the crucible assembly while the cover member covers a portion of the charge. The cover member is raised after the melt has been formed.

Yet another aspect of the present disclosure is directed to a crystal pulling system for growing a monocrystalline ingot from a silicon melt. The system has a pull axis and includes a housing defining a growth chamber. A crucible assembly is disposed within the growth chamber for containing the silicon melt. The system includes a heat shield that defines a central passage through which an ingot passes during ingot growth. A cover member is moveable within the heat shield along the pull axis. The cover member includes a first plate having a first plate axis that is parallel to the pull axis. The cover member includes a second plate having a second plate axis that is parallel to the pull axis. The second plate is disposed above the first plate.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
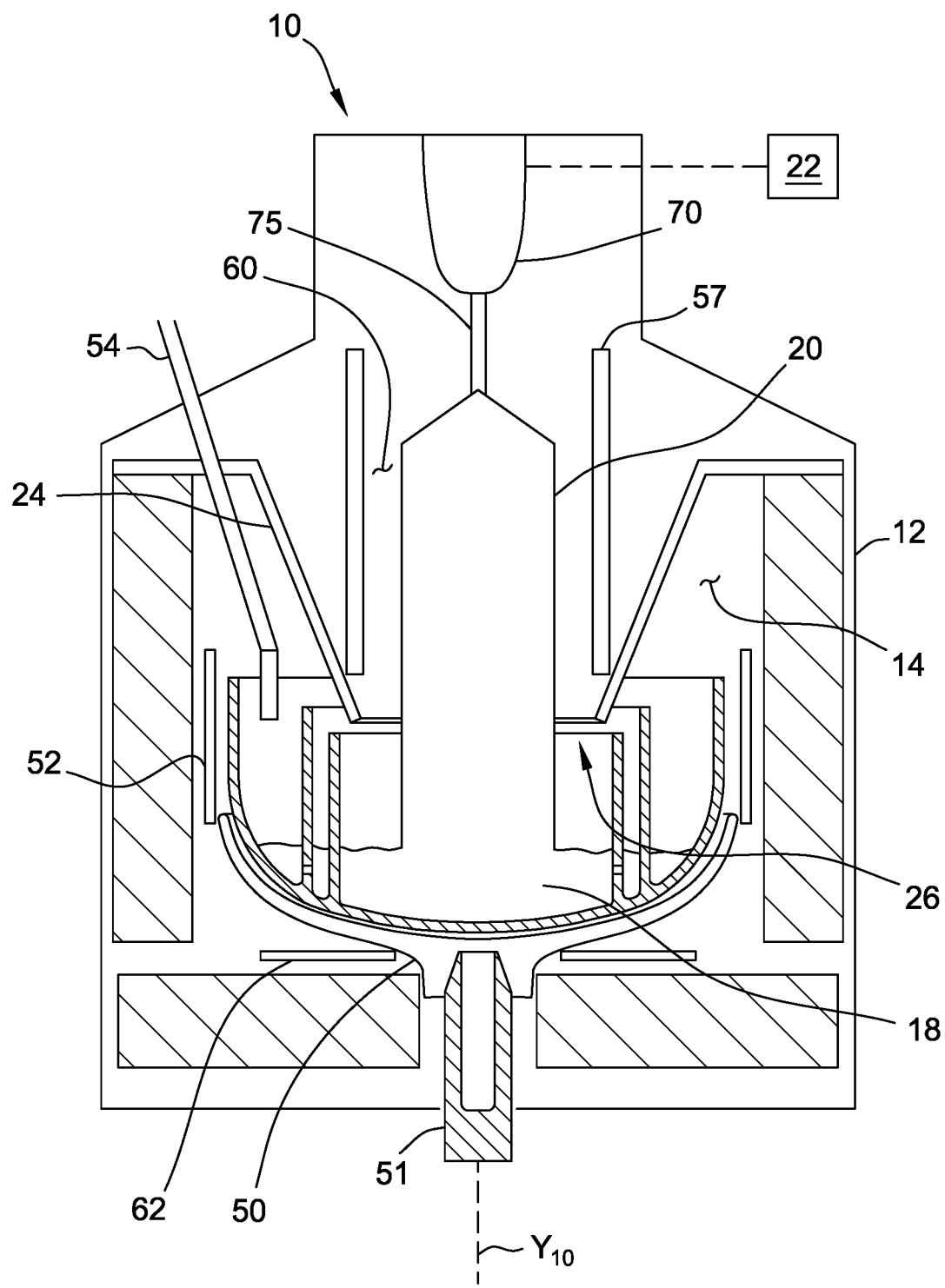
FIG. 1 is a cross-section view of a crystal pulling system for growing a monocrystalline ingot from a silicon melt.

Provisions of the present disclosure relate to a crystal pulling system for producing monocrystalline (i.e., single crystal) silicon ingots (e.g., semiconductor or solar-grade material) from a silicon melt by the continuous Czochralski (CZ) method. The systems and methods disclosed herein may also be used to grow monocrystalline ingots by a batch or recharge CZ method. With reference to FIG. 1, the crystal pulling system is shown schematically and is indicated generally at 10. The crystal pulling system 10 includes a pull axis $Y_{10}$ and a housing 12 defining a growth chamber 14. A crucible assembly 16 is disposed within the growth chamber 14. The crucible assembly 16 contains the silicon melt 18 (e.g., semiconductor or solar-grade material) from which a monocrystalline ingot 20 is pulled by a pulling mechanism 22 as discussed further below.

The crystal pulling system 10 includes a heat shield 24 (sometimes referred to as a "reflector") that defines a central passage 26 through which the ingot 20 passes during ingot growth. In accordance with embodiments of the present disclosure, prior to the ingot 20 being drawn from the melt 18, during an initial melting phase, a cover member 100 (FIG. 2) is lowered to at least partially cover the solid charge of polycrystalline silicon to reduce heat that radiates through the central passage 26 during meltdown. The cover member 100 is moveable within the heat shield 24 along the pull axis $Y_{10}$.

Figure 2:
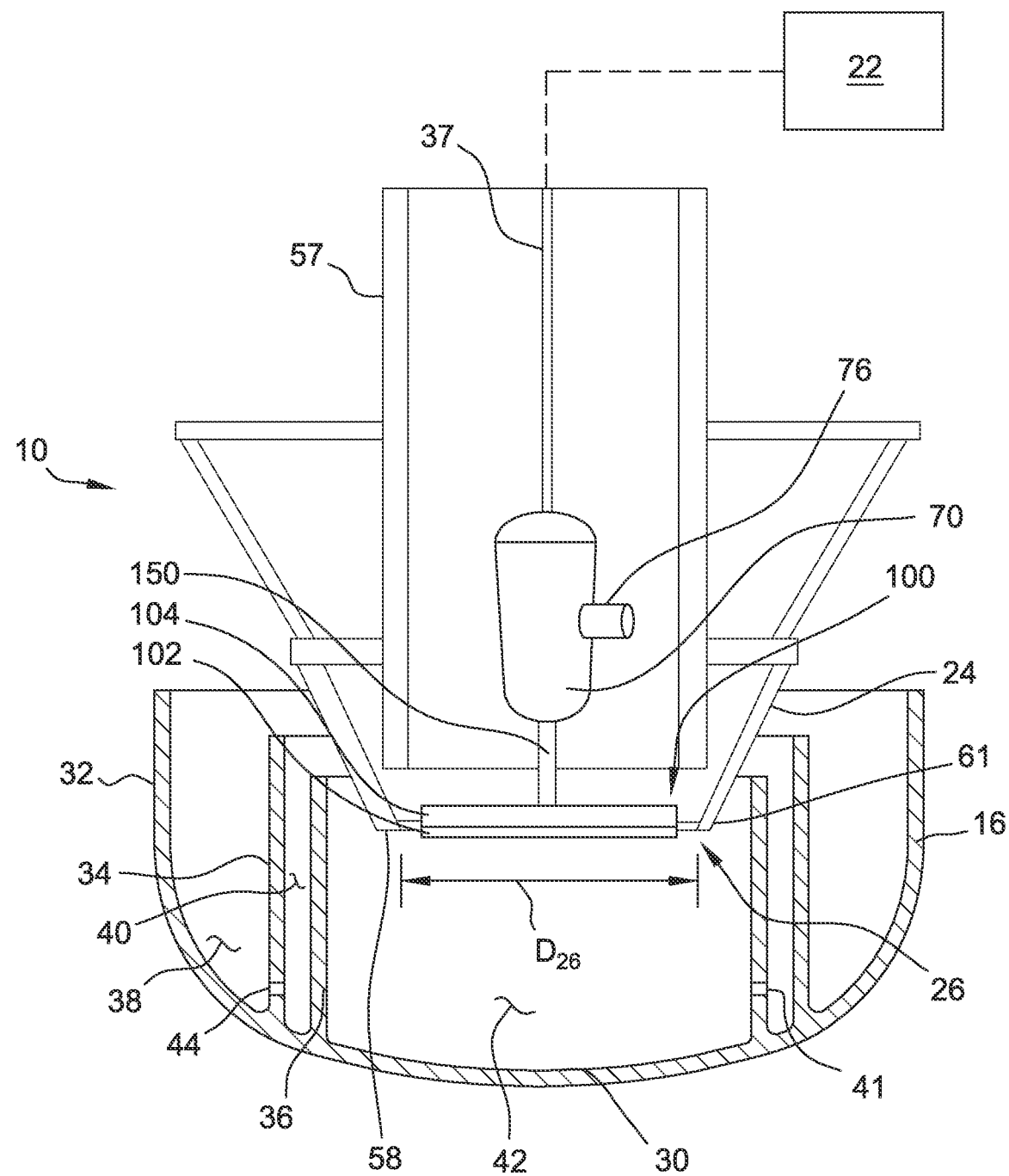
FIG. 2 is a cross-section view of a portion of the crystal pulling system, including a cover member disposed within a central passage of a heat shield.

FIG. 2 shows a portion of the crystal pulling system 10 with the cover member 100 arranged within the central passage 26 during an initial phase in which the charge is melted (i.e., meltdown phase), prior to the ingot 20 being drawn. The crucible assembly 16 includes a bottom 30 and an outer sidewall 32 that extends upwards from the bottom 30. The crucible assembly 16 includes a central weir 34 and an inner weir 36 that extends upward from the bottom 30. The central weir 34 is disposed between the outer sidewall 32 and the inner weir 36. The crucible assembly 16 includes a crucible melt zone 38 disposed between the outer sidewall 32 and the central weir 34. The crucible assembly 16 also contains an intermediate zone 40 disposed between the central weir 34 and the inner weir 36. The crucible assembly 16 also contains a growth zone 42 disposed within the inner weir 36. The crucible assembly 16 may be made of, for example, quartz or any other suitable material that enables the crystal pulling system 10 to function as described herein. Further, the crucible assembly 16 may have any suitable size that enables the crystal pulling system 10 to function as described herein. The crucible assembly 16 may also include three "nested" crucibles which have separate bottoms that together make a bottom and in which the sidewalls of the crucibles are the weirs 34, 36 described above.

During ingot growth, polycrystalline silicon is added to the crucible melt zone 38 where the silicon melts and replenishes the silicon melt. Silicon melt flows through a central weir opening 44 and into the intermediate zone 40. The silicon melt then flows through an inner weir opening 41 to the growth zone 42 disposed within the inner weir 36. The various silicon melt zones (e.g., melt zone 38, intermediate zone 40 and growth zone 42) allow the ingot to be grown in accordance with continuous Czochralski methods in which polycrystalline silicon is continuously or semi-continuously added to the melt while an ingot 20 is continuously pulled from the growth zone 42. The silicon melt 18 within the growth zone 42 is contacted with a single seed crystal 75 (FIG. 1). As the seed crystal 75 is slowly raised from the melt 18, atoms from the melt 18 align themselves with and attach to the seed to form the ingot 20.

The crucible assembly 16 is supported by a susceptor 50 (FIG. 1). The susceptor 50 is supported by a rotatable shaft 51. A side heater 52 surrounds the susceptor 50 and crucible assembly 16 for supplying thermal energy to the system 10. One or more bottom heaters 62 are disposed below the crucible assembly 16 and susceptor 50. The heaters 52, 62 operate to melt an initial charge of solid polycrystalline silicon feedstock, and maintain the melt 18 in a liquefied state after the initial charge is melted. The heaters 52, 62 also act to melt solid polycrystalline silicon added through feed tube 54 (FIG. 1) during growth of the ingot. The heaters 52, 62 may be any suitable heaters that enable to system 10 to function as described herein (e.g., resistance heaters).

The crystal pulling system 10 includes a gas inlet (not shown) for introducing an inert gas into the growth chamber 14, and one or more exhaust outlets (not shown) for discharging the inert gas and other gaseous and airborne particles from the growth chamber 14. The gas inlet supplies suitable inert gases such as argon.

The system 10 includes a cylindrical jacket 57 disposed with the heat shield 24. The jacket 57 is fluid-cooled and includes a jacket chamber 60 that is aligned with the central passage 26. The ingot 20 is drawn along the pull axis $Y_{10}$, through the central passage 26 and into the jacket chamber 60. The jacket 57 cools the drawn ingot 20.

The heat shield 24 is generally frustoconical in shape. The heat shield 24 includes an outer surface 61 which faces the crucible assembly 16 and the melt 18. The heat shield 24 may be coated to prevent contamination of the melt. In some embodiments, the heat shield 24 is made of two graphite shells that include molybdenum sheets therein. The surface 61 may be coated (e.g., SiC) to reduce contamination of the melt.

The heat shield 24 includes a bottom 58 (FIG. 2). The central passage 26 of the heat shield 24 has a diameter $D_{26}$ at the bottom 58 of the heat shield 24. The heat shield 24 is disposed above the crucible assembly 16, such that the central passage 26 is arranged directly above the growth zone 42 so that the ingot drawn from the melt 18 may be pulled through the central passage 26. The passage diameter $D_{26}$ is sized to accommodate the diameter of the ingot 20 (e.g., 200 mm or 300 mm or other diameter ingots).

The outer surface 61 may be coated with a reflective coating which reflects radiant heat back towards the melt 18 and the crucible assembly 16. As such, the heat shield 24 assists in retaining heat within the crucible assembly 16 and the melt 18. In addition, the heat shield 24 aids in maintaining a generally uniform temperature gradient along the pull axis $Y_{10}$.

During the initial melting phase, an initial amount of solid polycrystalline silicon is loaded to a crucible melt zone 38, intermediate zone 40 and growth zone 42. In other embodiments, solid polycrystalline silicon is added to only one or two of the zones selected between the crucible melt zone 38, intermediate zone 40 and growth zone 42. During meltdown, the cover member 100 is lowered to cover at least a portion of the silicon charge while the initial charge is melted (i.e., by occluding the central passage 26 of the heat shield 24). The pulling mechanism 22 raises and lowers the cover member 100.

In accordance with embodiments of the present disclosure, the cover member 100 is lowered to within less than 30 mm from the bottom 58 of the heat shield 24 (i.e., from below or above the bottom 58), or less than 20 mm, less than 10 mm, or less than 5 mm from the bottom 58 of the heat shield 24. In some embodiments, the cover member 100 is lowered such that it is aligned with the bottom 58 of the heat shield 24. In some embodiments, the cover member 100 is lowered to within 80 to 100 mm of the surface of the charge during melt down.

After the initial amount of silicon charge has been melted, a secondary amount of polycrystalline silicon may be added to the crucible melt zone 38 (e.g., continuously added until the entire secondary amount is added). In accordance with some embodiments of the present disclosure, the cover member 100 covers the central passage 26 while this secondary amount of polycrystalline silicon is added to the melt zone 38 and melted down. After the secondary charge has melted, the cover member 100 is raised by the pulling mechanism 22. In other embodiments, the cover member 100 is not used while the secondary amount of polycrystalline silicon is added.

Figure 3:
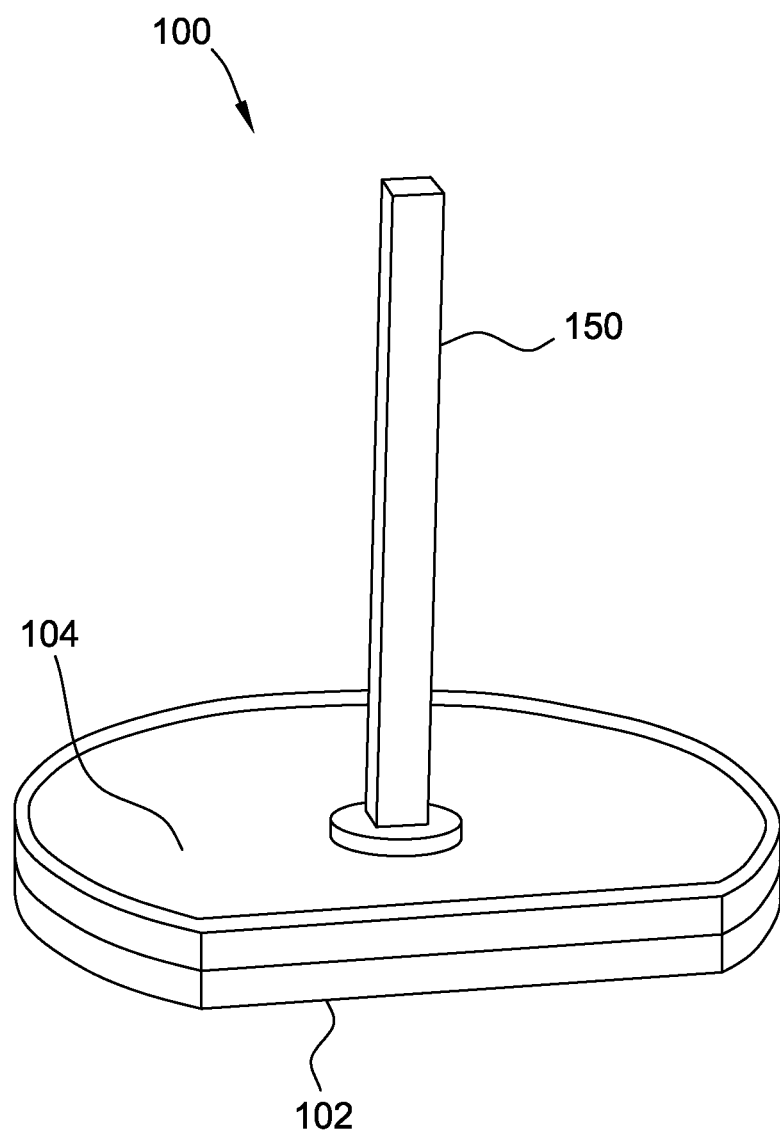
FIG. 3 is a perspective view of a cover member of the crystal pulling system.

An embodiment of the cover member 100 is shown in FIG. 3. The cover member 100 includes a first plate 102 and a second plate 104 (which may also be referred to herein as "lower plate 102" and "upper plate 104", respectively). Each plate 102, 104 has a central axis that is generally parallel to the pull axis $Y_{10}$ (FIG. 1). The first plate 102 and the second plate 104 are generally parallel. The second plate 104 is disposed above the first plate 102.

Figure 5:
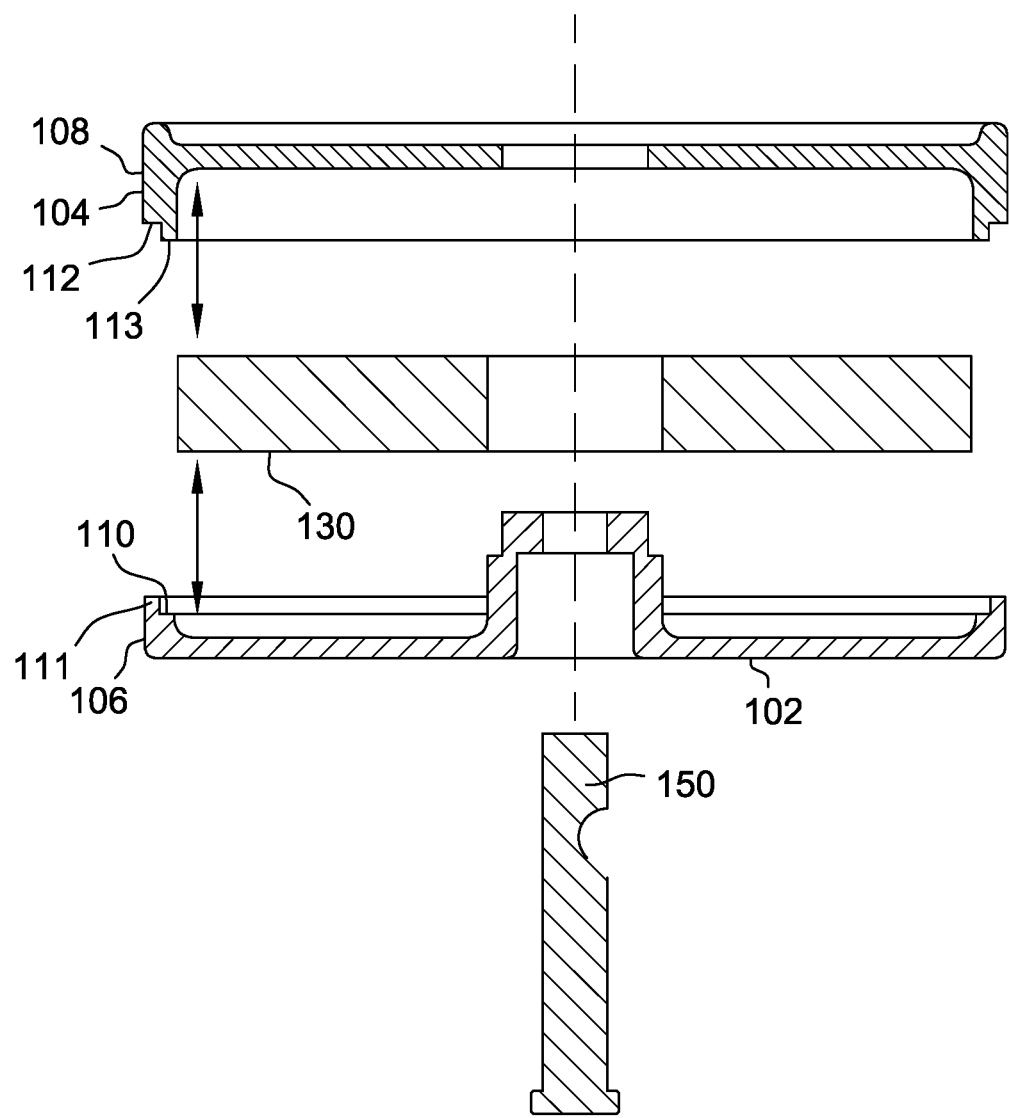
FIG. 5 is an assembly view of the cover member.
Figure 6:
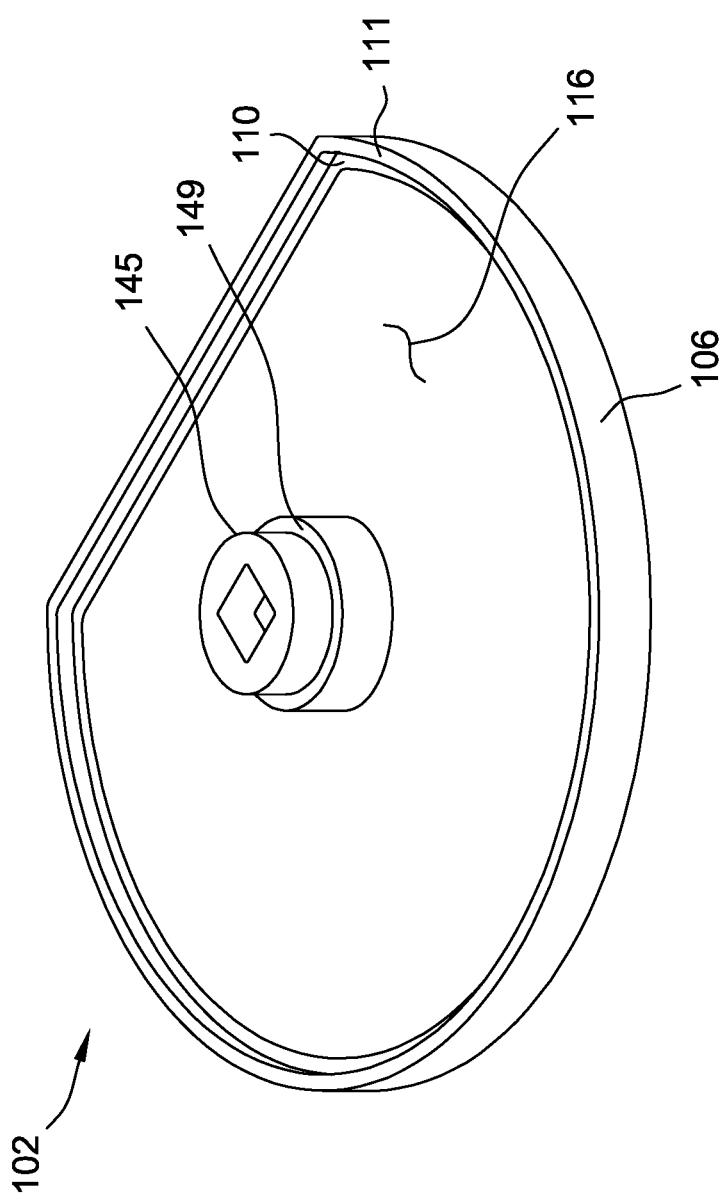
FIG. 6 is a perspective view of a first plate of the cover member.
Figure 8:
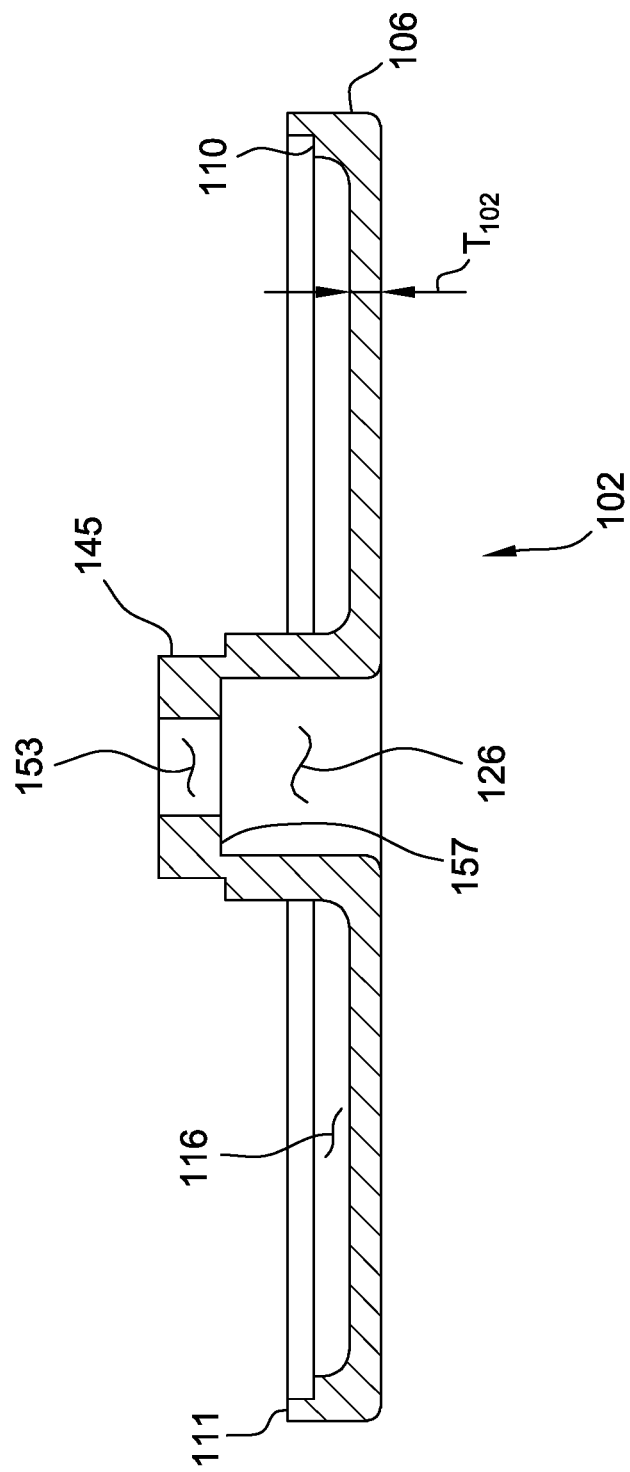
FIG. 8 is a cross-section view of the first plate.
Figure 9:
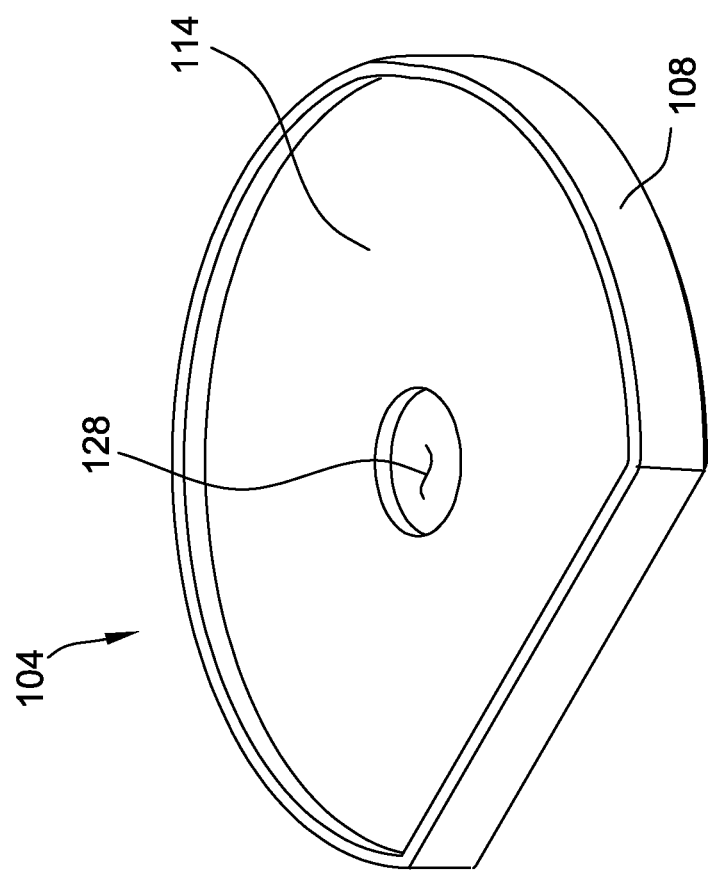
FIG. 9 is a perspective view of a second plate of the cover member.
Figure 10:
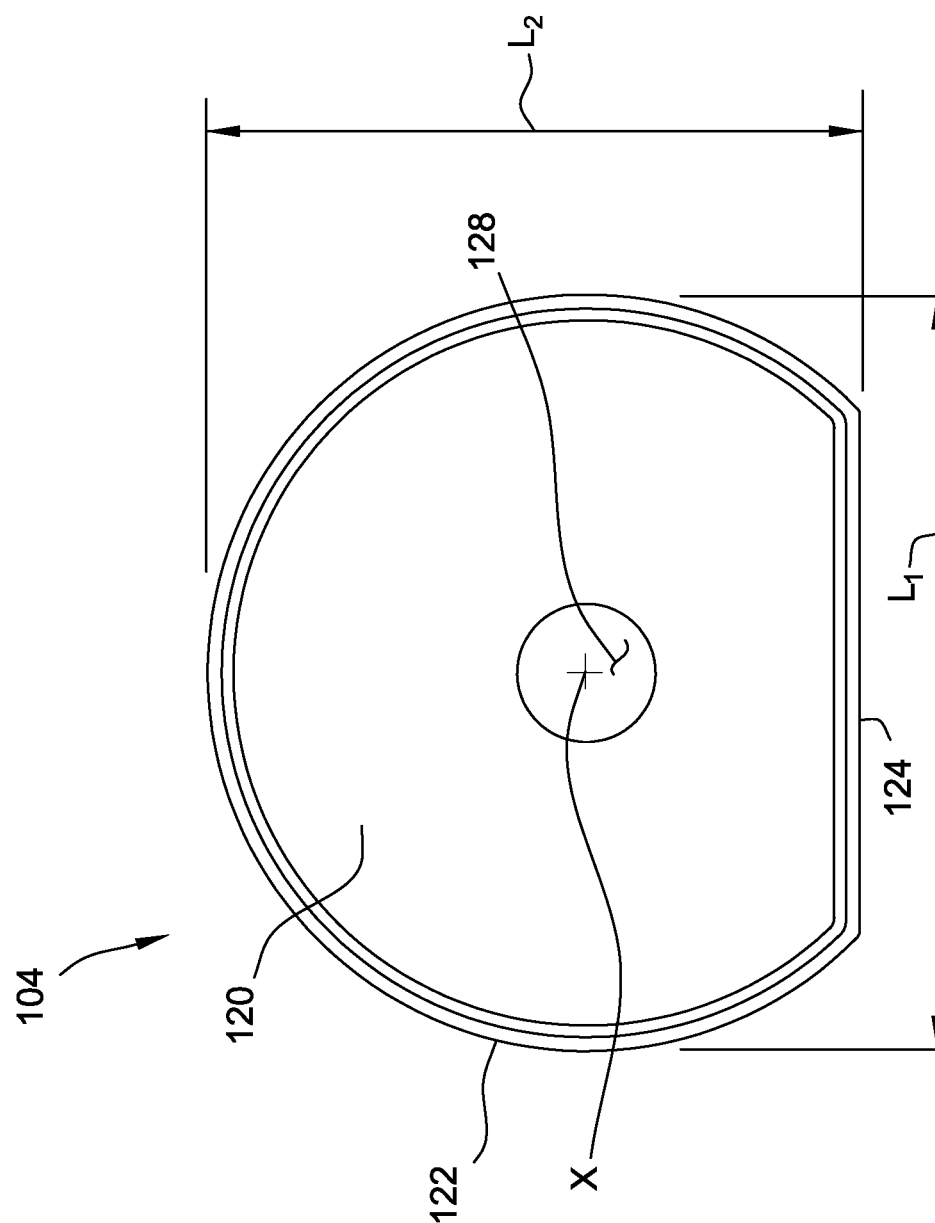
FIG. 10 is a top view of the second plate.
Figure 11:
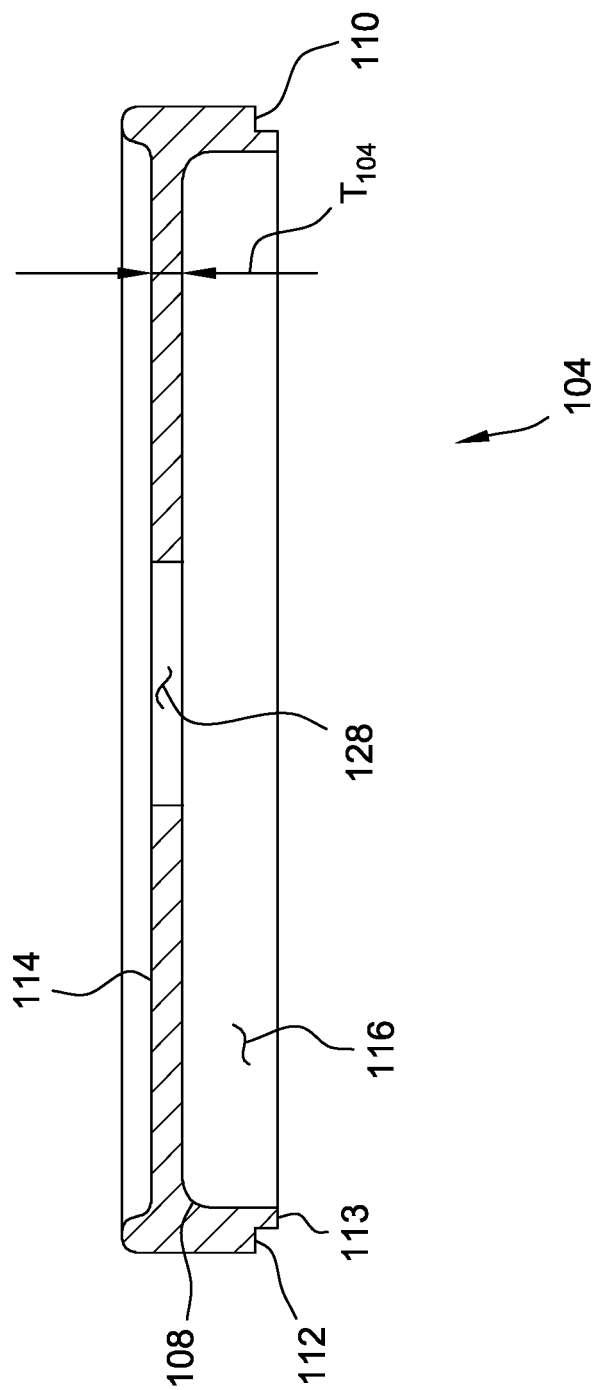
FIG. 11 is a cross-section view of the second plate.

The first plate 102 includes a first annular wall 106 (FIGS. 5-6) and the second plate 104 includes a second annular wall. 108 (FIG. 9). Referring now to FIG. 5, the first wall 106 includes a first shoulder 110 and a first lip 111. The second wall 108 includes a second shoulder 112 and second lip 113. When assembled, the second shoulder 112 rests on the first lip 111 and the second lip 113 rests on the first shoulder 110. A cover member chamber 116 (FIGS. 8 and 11) is disposed between the first and second plates 102, 104.

Figure 4:
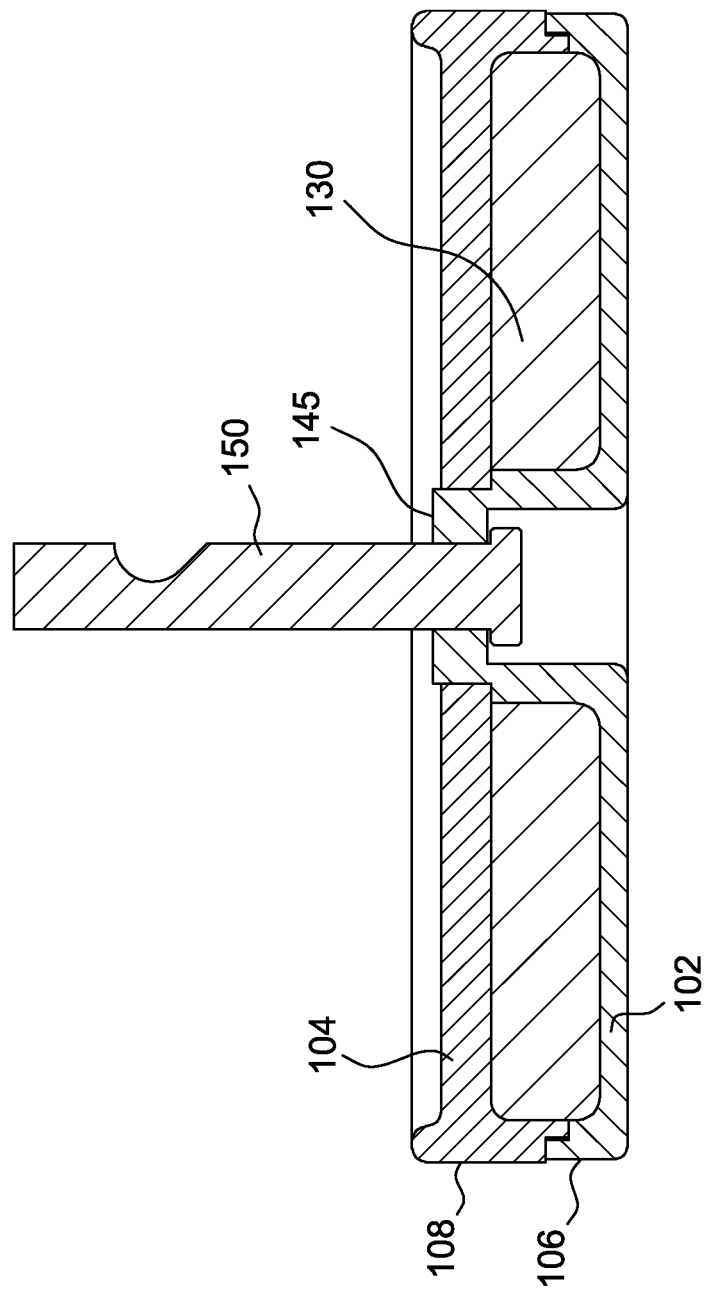
FIG. 4 is a cross-section view of the cover member.

An insulation layer 130 (FIG. 4) is disposed within the chamber 116 formed between the first and second plates 102, 104. The insulation layer 130 has a thickness of $T_{130}$ (e.g., 10 mm to about 50 mm). The insulation layer 130 may be compressed between the first plate 102 and the second plate 104. The insulation layer 130 may include several stacked layers of insulation or may be a single layer. The insulation layer 130 may include an opening 132 formed therein.

The insulation layer 130 may be made of felt. The felt may be composed of natural or synthetic fibers. The felt may be purified felt (e.g., with a max ash of 30 ppm). The insulation layer 130 may generally be composed of any material that includes suitable insulating properties.

Figure 12:
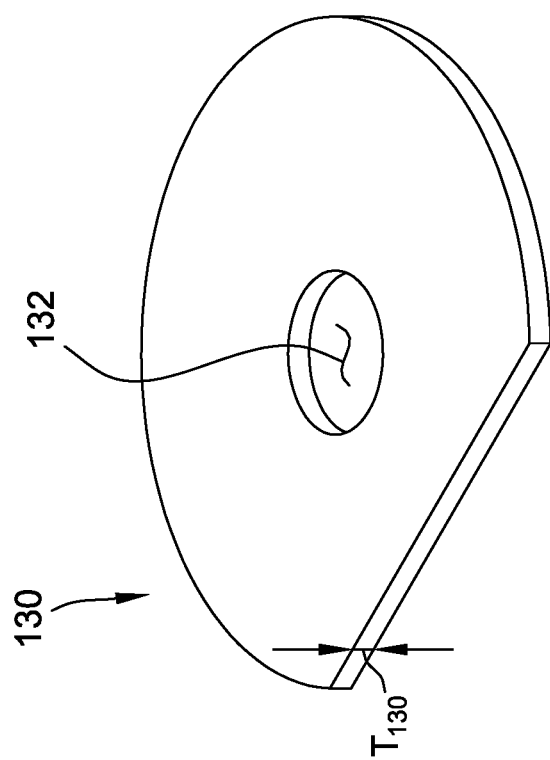
FIG. 12 is a perspective view of an insulating layer of the cover member.

The first plate 102 includes a hub 145 (FIG. 4) that protrudes upward for connecting a shaft 150. The second plate includes a second plate opening 128 (FIG. 9). The hub 145 extends through the opening 128 of the second plate 104 and through the insulation opening 132 (FIG. 12). The hub 145 includes a ledge 149 (FIG. 6) with the second plate 104 being seated on the ledge 149. The hub 145 includes a hub opening 153 (FIG. 8) through which the shaft 150 extends. The hub opening 153 has a profile that matches the profile of the shaft 150 (e.g., square or rectangular as in the illustrated embodiment or other shape such as circular). The hub 145 includes a hub chamber 126 having a top wall 157.

Figure 7:
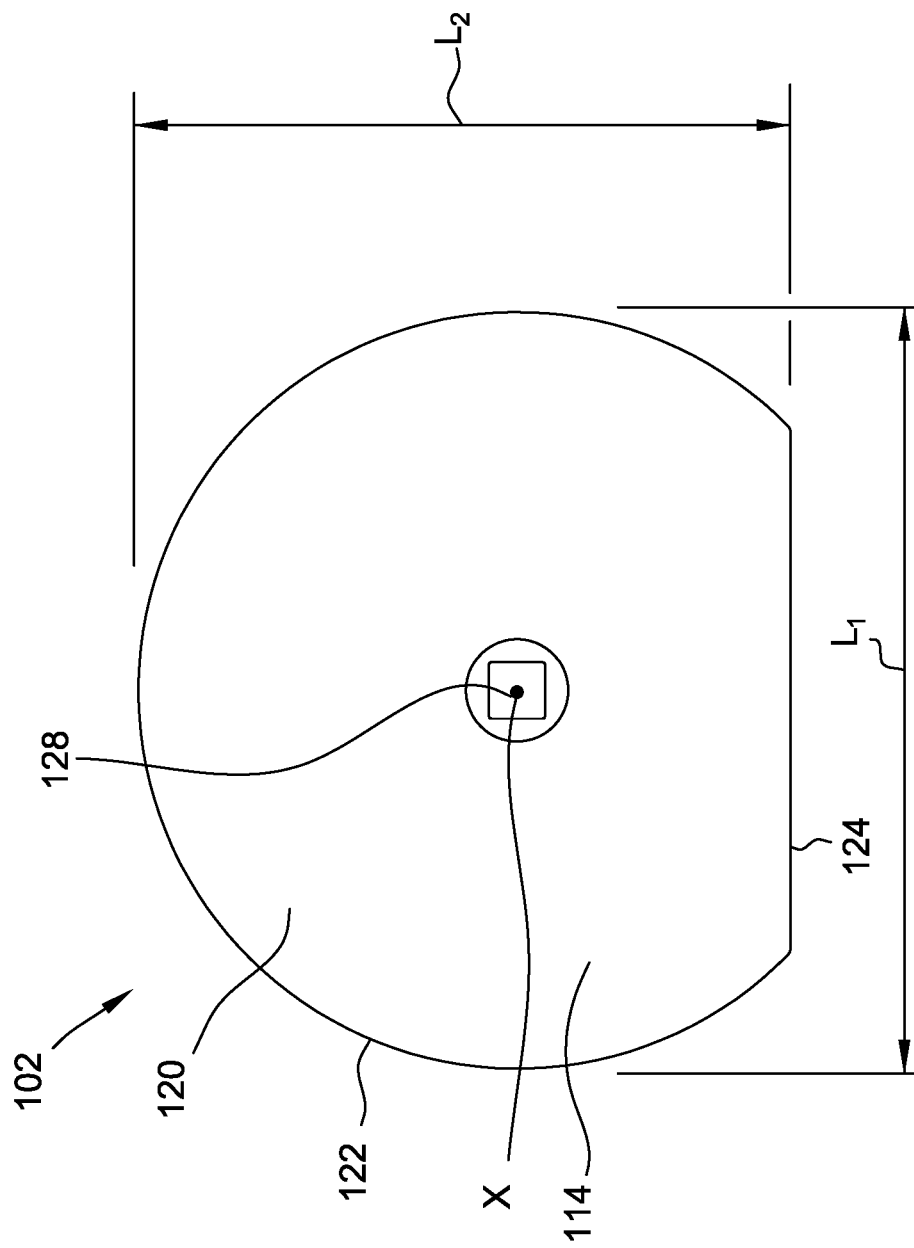
FIG. 7 is a bottom view of the first plate.

The cover member 100 is generally in the shape of a circular segment having a circular portion 120 (FIG. 7) including a center X and a circumference 122 and having a linear edge 124.

Specifically, the first and second plates 102, 104 have the shape of a circular portion with a segment along a chord that has been removed. The first and second plates 102, 104 include a major length $L_1$ and a minor length $L_2$. The major length $L_1$ is a diameter of the circular portion 120 and the minor length $L_2$ extends from the linear edge 124, through the center X to the circumference 122 of the circular portion 120. The first and second plates 102, 104 are shaped as a circular segment to allow the charge/melt to be viewed. In other embodiments, the cover member 100 is fully circular.

In some embodiments, the diameter of the cover member 100 is at least 0.75 times the diameter of the central passage 26 at the bottom 58 of the heat shield 24 or, as in other embodiments, at least 0.8 times, at least 0.9 times, at least 0.95 times, or at least 0.99 times the diameter of the central passage 26 at the bottom 58 of the heat shield 24.

In some embodiments, the first plate 102 and second plates 104 are made of graphite. The graphite may be coated with silicon carbide (SiC). The first and second plate 102, 104 may be composed of other suitable materials. The first and second plates 102, 104 have any suitable thickness $T_{102}$, $T_{104}$ (FIGS. 8 and 11) that prevents thermal stresses which result in cracking or damage of the first and second plates 102, 104 (e.g., thickness between 3 mm and 50 mm).

Figure 13:
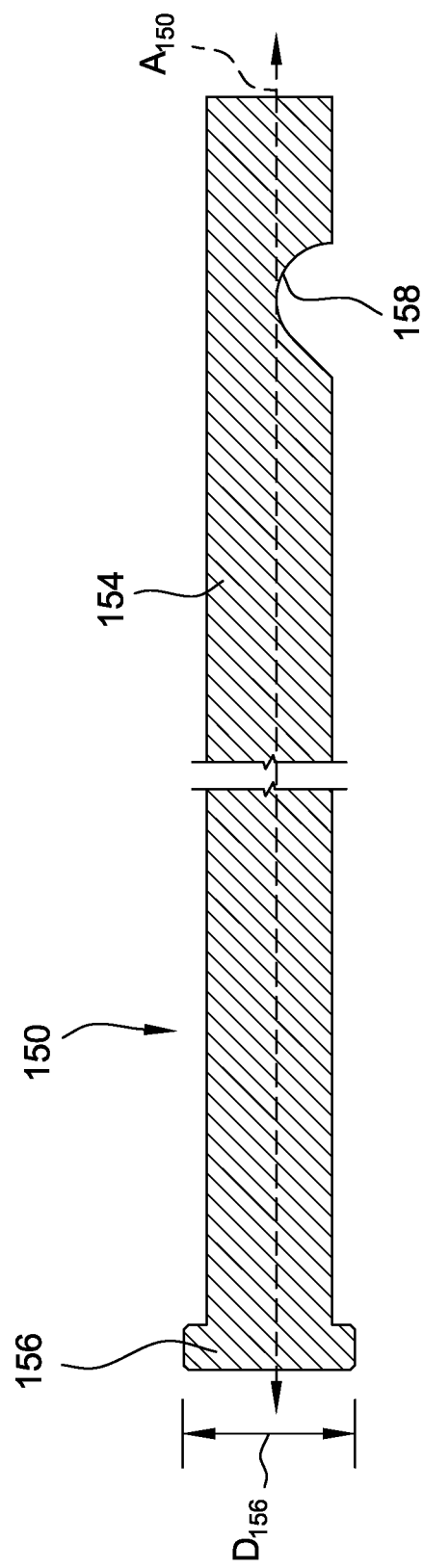
FIG. 13 is a cross-section view of a shaft of the cover member.
Figure 14:
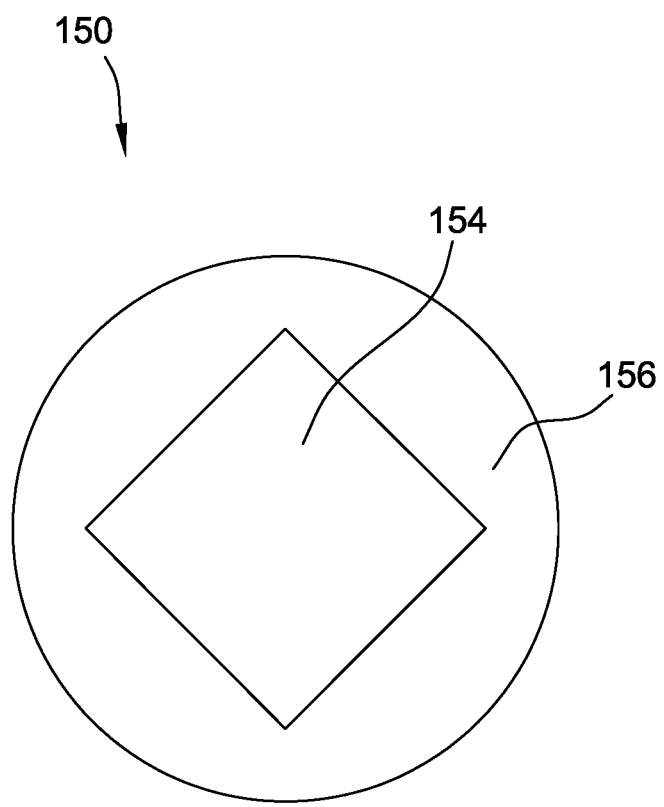
FIG. 14 is top view of the shaft.

With reference to FIGS. 13-14, the cover member 100 includes a shaft 150 that supports the cover member 100. The shaft 150 may be connected to the first and/or second plates 102, 104 in any suitable coupling arrangement. In the illustrated embodiment, the shaft 150 includes an elongated rectangular portion 154 and a collar 156. The collar 156 has a diameter $D_{156}$ less than a diameter of the hub chamber 126 (FIG. 8) and greater than the width of the hub opening 153. The first plate 102 rests on the collar 156. The insulation layer 130 and second plate 104 (FIG. 4) are supported by the first plate 102. Alternatively, the shaft 150 may be formed integrally with either or both of the first plate 102 and/or second plate 104. The shaft 150 includes a shaft axis $A_{150}$.

Figure 15:
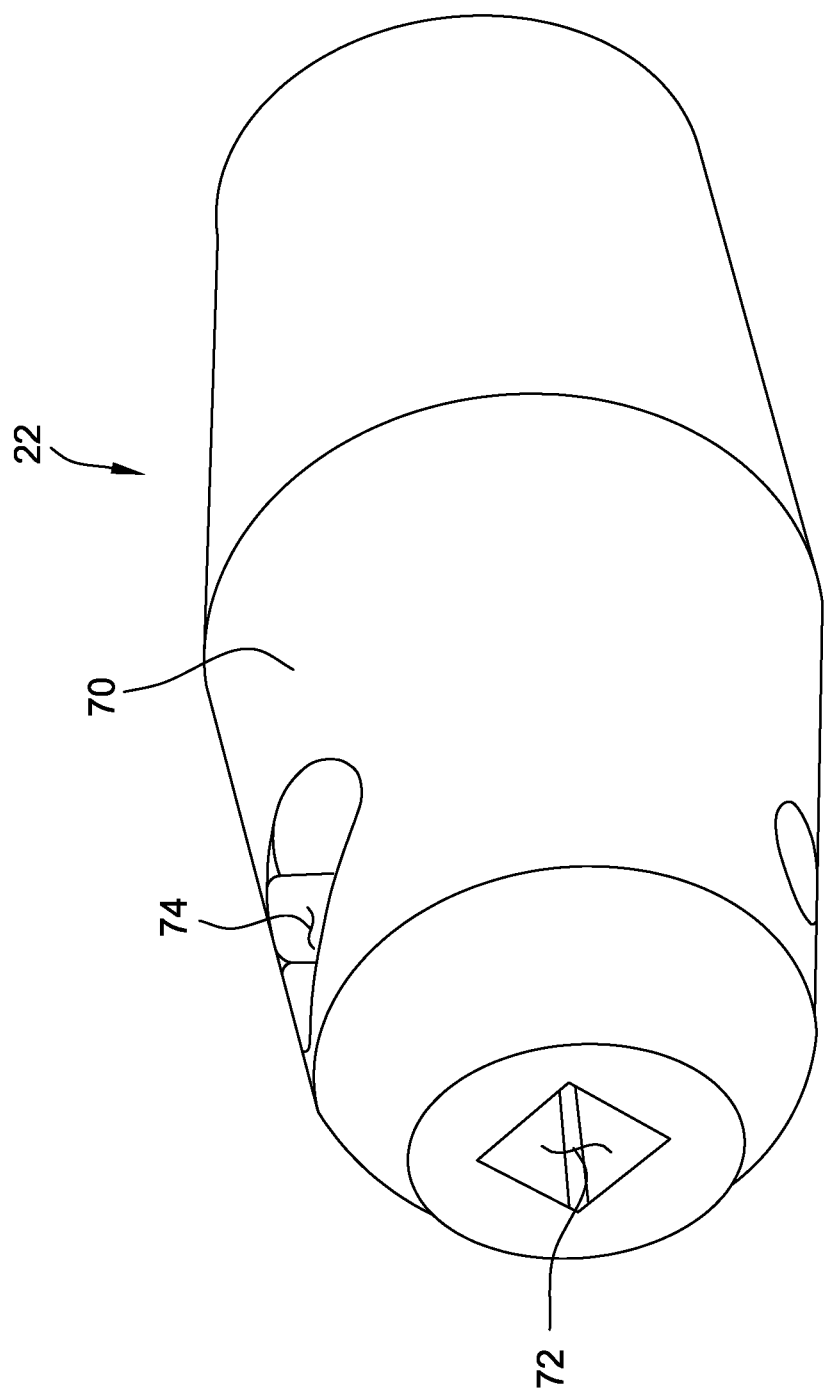
FIG. 15 is a perspective view of a chuck of the crystal pulling system.
Figure 16:
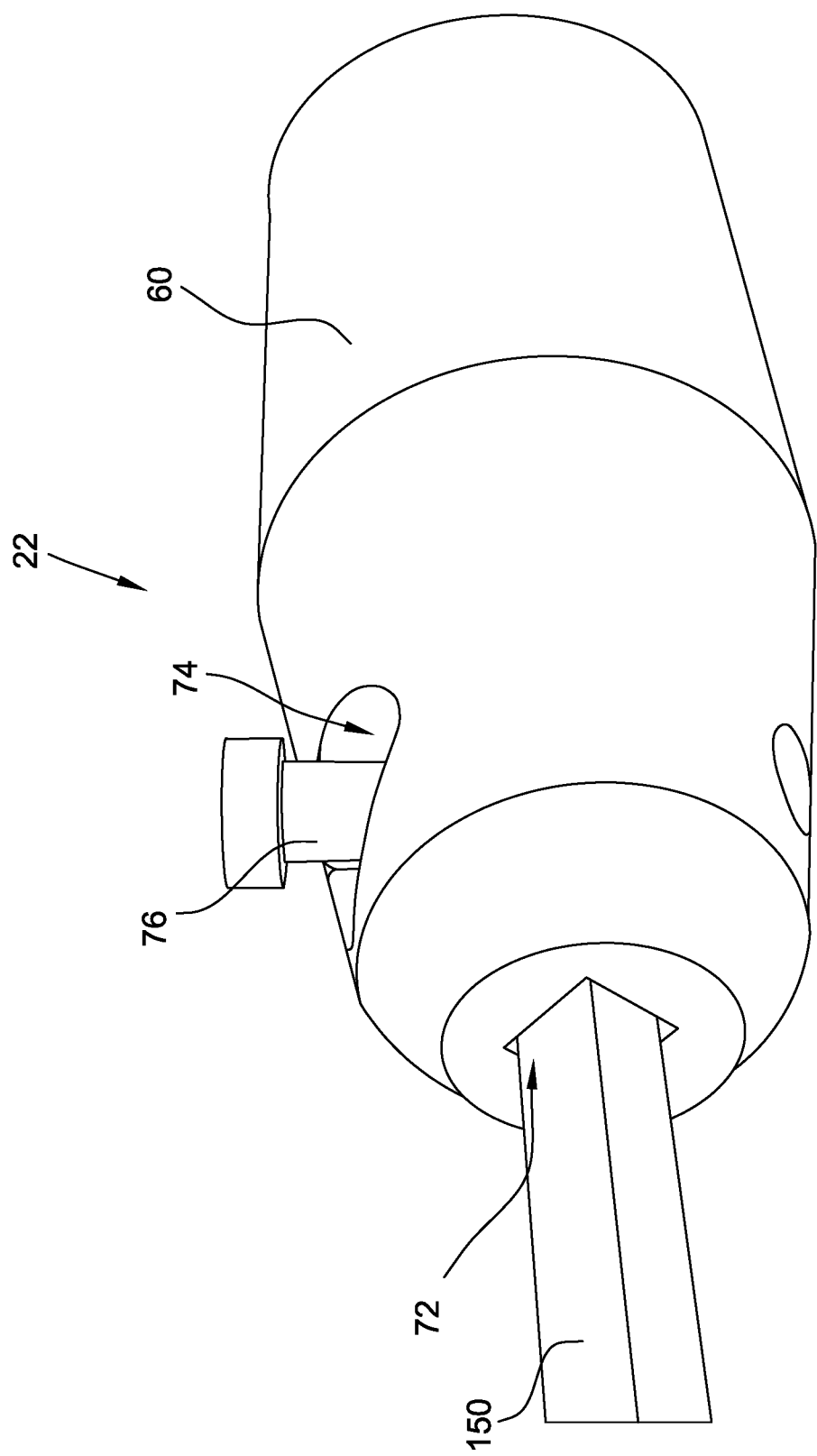
FIG. 16 is a perspective view of the chuck engaged with the shaft of the cover member.

With reference to FIGS. 15-16, the pulling mechanism 22 includes a chuck 70 that is raised and lowered along the pull axis $Y_{10}$. The chuck 70 may be connected to a pull wire or cable 37 that is raised and lowered by a drive motor (i.e., the pull wire or cable and motor are part of the pulling mechanism 22). The cover member 100 is removably connectable to the chuck 70. For example, the shaft 150 and the chuck 70 may be connected using a pin lock. The shaft 150 includes a recess 158 (FIG. 13).

The shaft 150 is inserted into a bore 72 within the chuck 70, such that the recess 158 is contained within the bore 72. The chuck 70 includes an opening 74 that extends generally perpendicularly to the bore 72, passing through the chuck 70 and opening into the bore 72. A pin 76 is inserted through the opening 74 and into the bore 72 such that the pin 76 becomes engaged with the recess 158 of the shaft 150 that is disposed within the bore 72. In this manner the shaft 150 and the chuck 70 are coupled. The shaft 150 and chuck 70 may include any alternative and/or additional features to couple the cover member 100 to the chuck 70.

After meltdown, the cover member 100 is disconnected from the chuck 70 and the seed crystal 75 (FIG. 1) is connected to the chuck 70. The seed crystal 75 may include a similar recess, not shown, such that the seed 75 may also be coupled and/or uncoupled to the chuck 70. During the ingot growth process, the seed 75 is lowered by the pulling mechanism 22 into contact with the melt 18 and then slowly raised from the melt 18. The cover member 100 and/or the seed crystal are selectively coupled and uncoupled to the chuck 70 so that the pull mechanism 22 may be used to raise and lower either the cover member 100 and/or the seed crystal 75.

Compared to conventional crystal pull systems, the crystal pull systems of embodiments of the present disclosure have several advantages. Use of a cover member that at least partially covers the charge during meltdown acts to reduce radiant heat loss in the vertical direction which reduces thermal stress in the crucible assembly. In embodiments of the present disclosure in which the cover member includes insulation disposed therein, heat loss through the cover member may be reduced. In embodiments in which the cover member includes insulation, heater power may be reduced and the lifetime of the crucible can be further increased.

EXAMPLES

The processes of the present disclosure are further illustrated by the following Examples. These Examples should not be viewed in a limiting sense.

Figure 17:
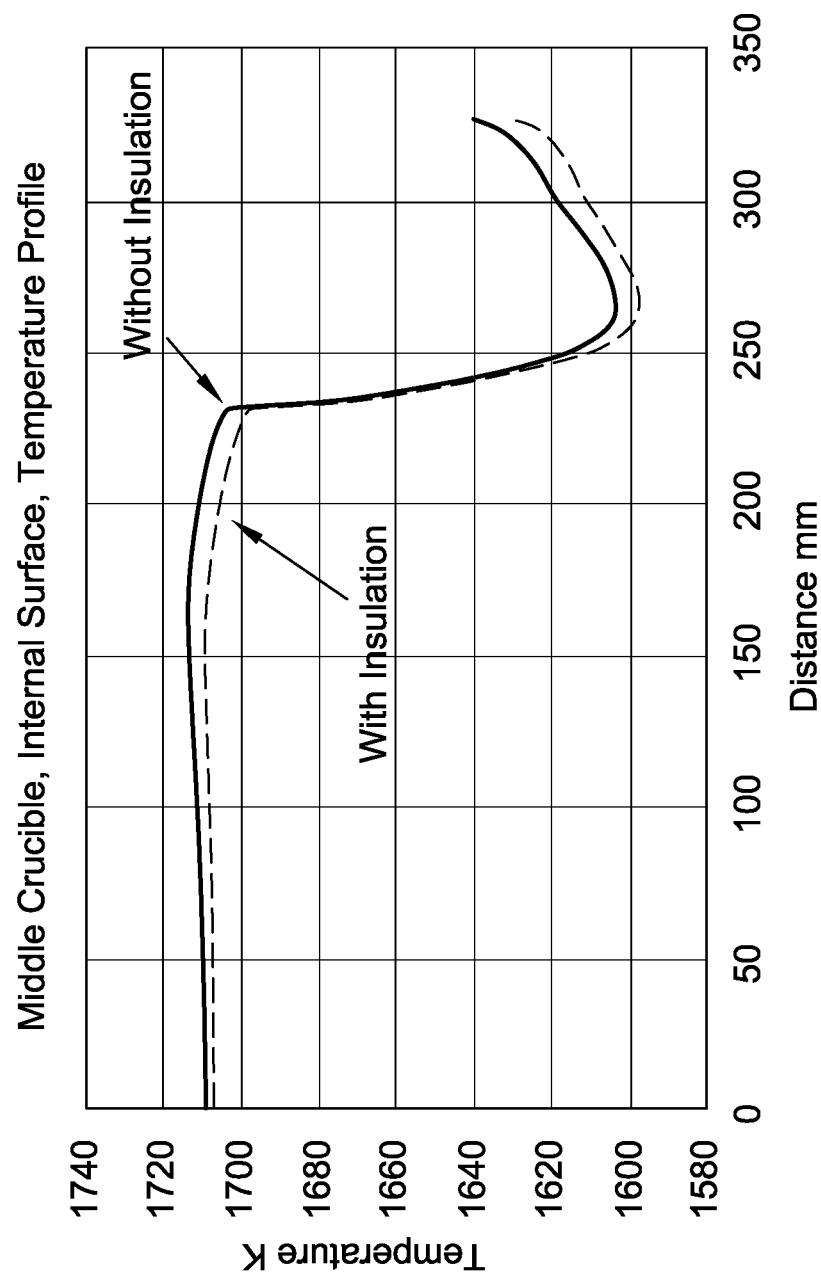
FIG. 17 is a graph of the internal temperature of an outer crucible of a nested crucible assembly when a cover member with and without insulation is used during meltdown.
Figure 18:
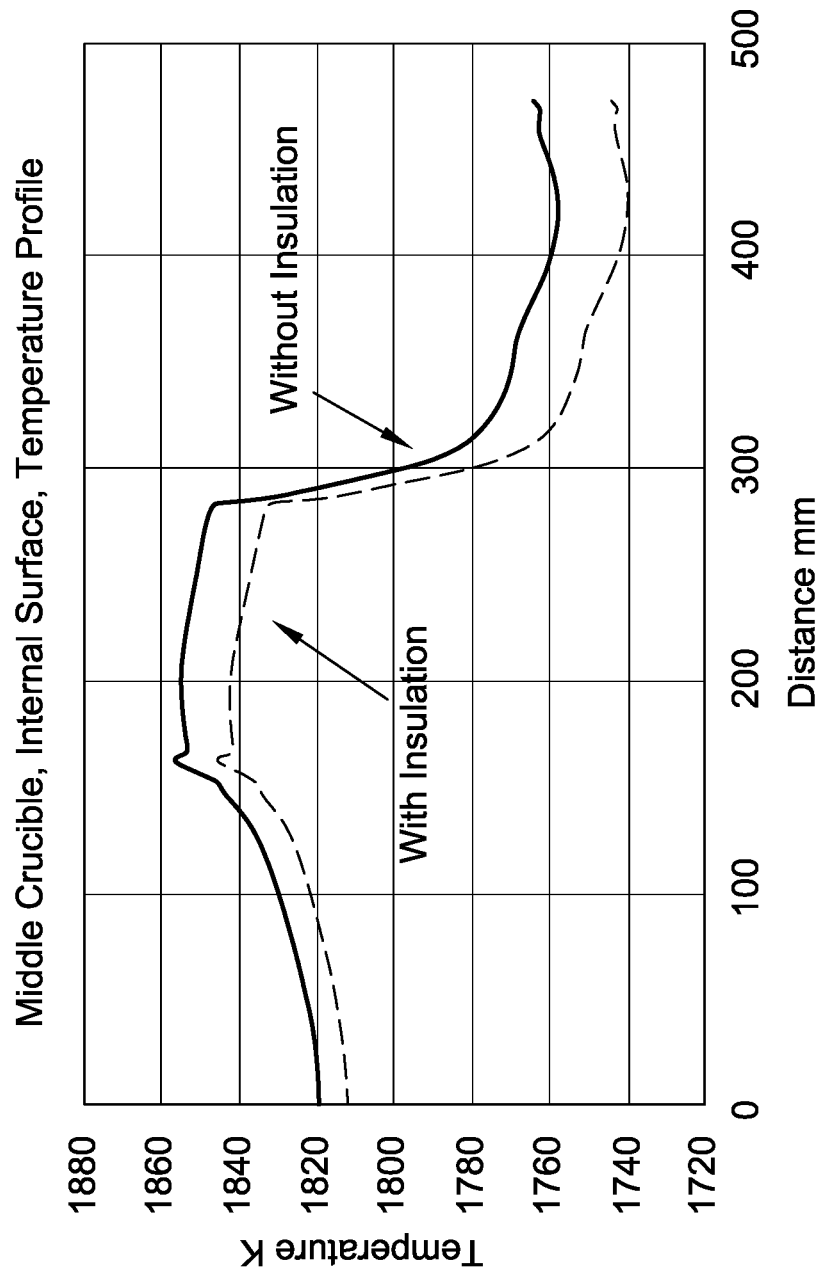
FIG. 18 is a graph of the internal temperature of a middle crucible of a nested crucible assembly when a cover member with and without insulation is used during meltdown.
Figure 19:
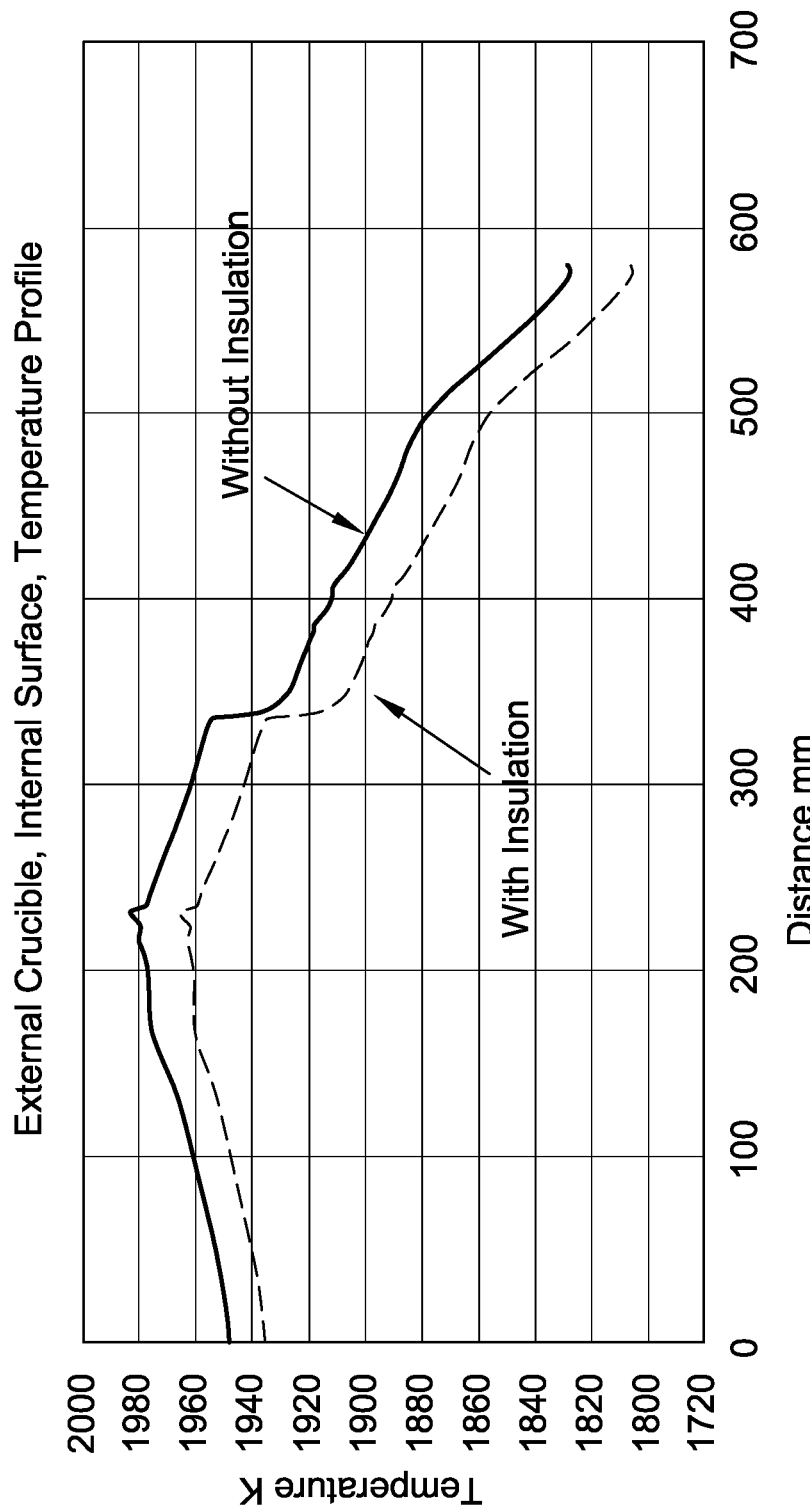
FIG. 19 is a graph of the internal temperature of an innermost crucible of a nested crucible assembly when a cover member with and without insulation is used during meltdown.

Example 1: Comparison of Crucible Temperature when a Cover Member with and without Insulation is Used During Meltdown Internal temperatures of the crucible assembly were modeled during the initial meltdown phase when a cover member similar to that shown in FIG. 4 was positioned at the bottom of the heat shield. Another cover member similar to that of FIG. 4 was used but the cover member did not include insulation (i.e., felt). A nested crucible assembly made of three crucibles was used. The cover member with insulation resulted in a lower temperature profile compared to the temperature profile of the crucible assembly when a cover member without insulation was used when the temperature was determined at the outer crucible/sidewall (FIG. 17), the central weir/middle crucible (FIG. 18), and the inner weir/innermost crucible (FIG. 19). The maximum decrease in temperature was 20° C. which occurred in the inner weir (FIG. 19). This decrease in temperature reduces damage to the crucible assembly.

Figure 20:
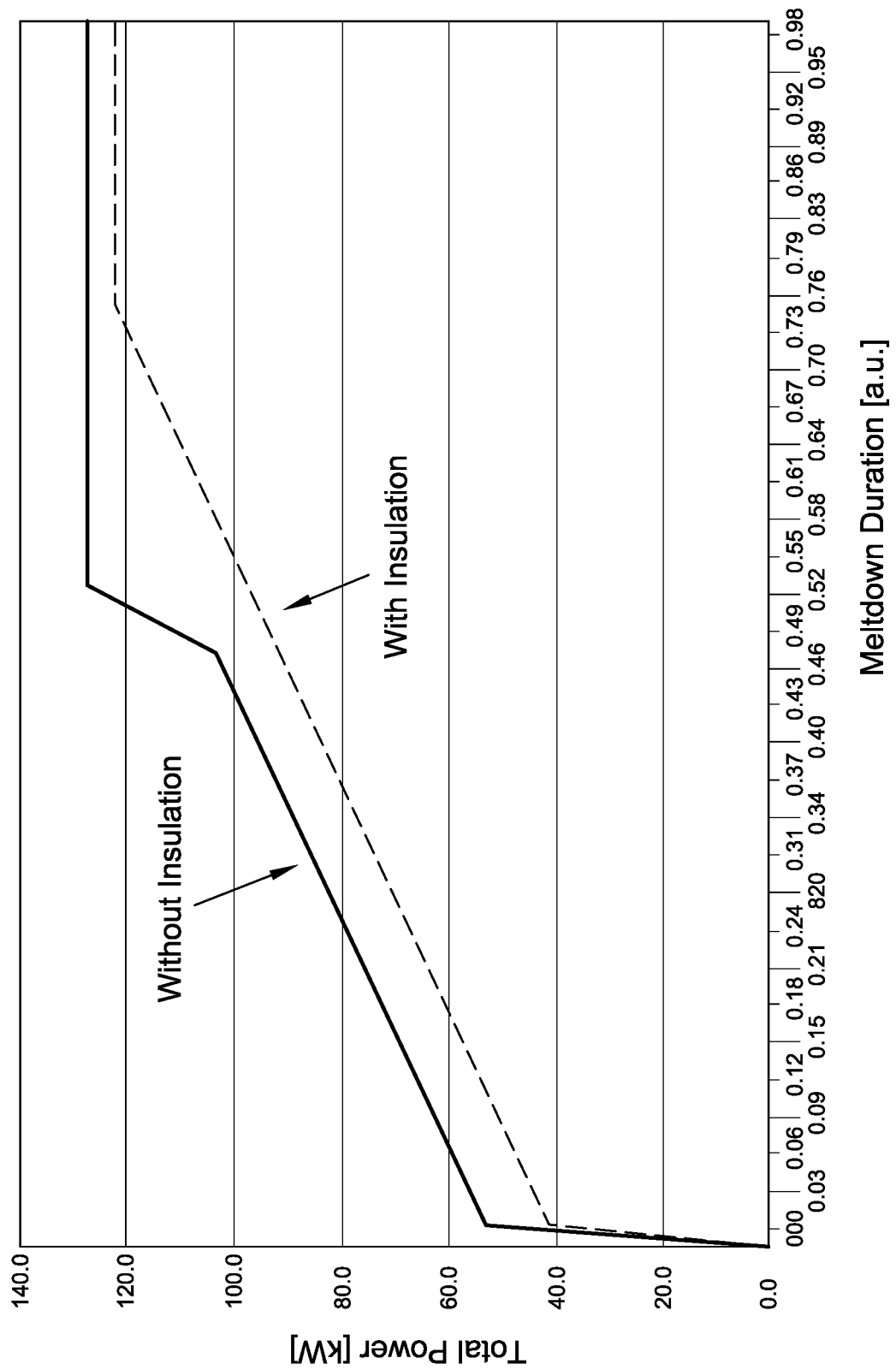
FIG. 20 is a graph of a power profile when a cover member with and without insulation is used during meltdown.

Example 2: Comparison of the Power Profiles when a Cover Member with and without Insulation is Used During Meltdown The power supplied to the crucible assembly during the initial melt phase (i.e., the power supplied to the heaters of the crystal pulling system) was determined when a cover member similar to that shown in FIG. 4 was positioned at the bottom of the heat shield and when another cover member similar to that of FIG. 4 was used but the cover member did not include insulation. The power supplied using the cover member with insulation was less than the power supplied using the cover member without insulation (FIG. 20). The maximum power supplied for the cover member without insulation was 5 kW greater than the maximum power supplied using the cover member with insulation.

As used herein, the terms "about," "substantially," "essentially," and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A crystal pulling system for growing a monocrystalline ingot from a silicon melt, the system having a pull axis and comprising:
   a housing defining a growth chamber;
   a crucible assembly disposed within the growth chamber for containing the silicon melt, the crucible assembly comprising a bottom and an outer sidewall that extends from the bottom;
   a heat shield that defines a central passage through which the monocrystalline ingot passes during ingot growth; and
   a cover member that is moveable within the heat shield along the pull axis, the cover member comprising:
      a first plate having a first plate axis that is parallel to the pull axis, the first plate comprising a hub, the hub having a hub opening;
      a second plate having a second plate axis that is parallel to the pull axis, the second plate being disposed above the first plate;
      one or more insulation layers disposed between the first plate and the second plate, the one or more insulation layers being made of felt, wherein the felt contacts the first plate and the felt contacts the second plate; and
      a shaft having an elongated portion and a collar, the collar being connected to and extending radially outward from the elongated portion, the shaft extending through the hub opening, the first plate resting on the collar.

2. The crystal pulling system as set forth in claim 1 wherein the first and second plates are both made of graphite.

3. The crystal pulling system as set forth in claim 2 wherein the first and second plates are silicon carbide coated.

4. The crystal pulling system as set forth in claim 1 wherein the heat shield has a bottom, the central passage of the heat shield having a diameter at the bottom of the heat shield, the cover member having a diameter, wherein the diameter of the cover member is at least 0.75 times the diameter of the central passage at the bottom of the heat shield.

5. The crystal pulling system as set forth in claim 1 wherein the crystal pulling system comprises a pulling mechanism comprising a chuck, the pulling mechanism capable of raising and lowering a chuck along the pull axis, the cover member being removably connectable to the chuck.

6. The crystal pulling system as set forth in claim 5 wherein the chuck is connectable to a seed crystal for initiating ingot growth.

7. The crystal pulling system as set forth in claim 1 wherein the crucible assembly comprises an inner weir that extends upward from the bottom.

8. The crystal pulling system as set forth in claim 7 wherein the crucible assembly comprises a central weir disposed between the outer sidewall and inner weir.

9. The crystal pulling system as set forth in claim 8 wherein the crucible assembly comprises three nested crucibles having separate bottoms which together form a bottom of the crucible assembly.

10. The crystal pulling system as set forth in claim 1 wherein the felt is composed of natural fibers.

11. The crystal pulling system as set forth in claim 1 wherein the felt is composed of synthetic fibers.

12. The crystal pulling system as set forth in claim 1 wherein the felt has an ash content of no more than 30 ppm.

* * * * *